United States Patent
Chen et al.

(10) Patent No.: US 7,702,982 B2
(45) Date of Patent: Apr. 20, 2010

(54) ELECTRONIC DEVICE TESTING SYSTEM AND METHOD

(75) Inventors: Chia-Ming Chen, Taipei County (TW); Su-Wei Tsai, Taipei (TW)

(73) Assignee: Test Research, Inc., Taipei (TW)

( * ) Notice: Subject to any disclaimer, the term of this patent is extended or adjusted under 35 U.S.C. 154(b) by 360 days.

(21) Appl. No.: 11/935,326

(22) Filed: Nov. 5, 2007

(65) Prior Publication Data
US 2009/0089635 A1 Apr. 2, 2009

(30) Foreign Application Priority Data
Sep. 28, 2007 (TW) .............................. 96136429 A

(51) Int. Cl.
*G01R 31/28* (2006.01)
(52) U.S. Cl. ...................... 714/727; 324/538
(58) Field of Classification Search ................ 324/500, 324/72.5, 690, 686, 517, 538; 106/14.11; 716/2; 714/727
See application file for complete search history.

(56) References Cited

U.S. PATENT DOCUMENTS

| | | | | |
|---|---|---|---|---|
| 5,254,953 A | * | 10/1993 | Crook et al. | 324/538 |
| 5,486,753 A | * | 1/1996 | Khazam et al. | 324/72.5 |
| 5,931,993 A | * | 8/1999 | Bradley | 106/14.11 |
| 6,671,860 B2 | * | 12/2003 | Langford, II | 716/2 |
| 6,903,360 B2 | * | 6/2005 | McAuliffe | 250/559.4 |
| 7,109,728 B2 | * | 9/2006 | Crook et al. | 324/690 |
| 7,242,198 B2 | * | 7/2007 | Schneider et al. | 324/686 |
| 7,327,148 B2 | * | 2/2008 | Schneider et al. | 324/517 |

* cited by examiner

*Primary Examiner*—David Ton
(74) *Attorney, Agent, or Firm*—Baker & McKenzie LLP

(57) ABSTRACT

The invention provides a testing system and method suitable for determining whether a pin-out of an electrical component is properly connected to a PCB. The testing system includes a testing signal source, a signal detector, a signal processor, an analysis unit and an integrated circuit having boundary-scan test function to provide testing signals to the device under test (DUT) whose signal traces are passing through inner layer of PCB in order to detect whether the sensed signal is an error signal.

15 Claims, 4 Drawing Sheets

ELECTRONIC DEVICE TESTING SYSTEM AND METHOD

FIELD OF INVENTION

The present invention relates to a testing system and method, particularity relates to a system and method of examining whether the connection pins of a device under test (DUT) are properly connected with a printed circuit board assembly.

BACKGROUND OF THE INVENTION

The testing procedure of print circuit board assembly (PCBA), an important step in the front-end processes is examining whether the pins on integrated circuits (ICs), connectors and other electronic devices are properly connected to the printed circuit board. Such test not only can increase product quality, it can also detect manufacturing defects in the front-end processes. Today, the "automatic optical inspection" method (AOI) has replaced the conventional manual inspections. The AOI method not only reduces cost and eliminates human errors, but it also increases the speed of inspection. However, AOI method can not be used to examine the pins, for example pins covered by the device itself such as in a "ball grid array" (BGA) packaged device. Such problem can be resolved by using an "automatic X-ray inspection" (AXI); however the cost for such inspection is high. The "in circuit tester" (ICT) provides another testing method. Under ICT, though it is required to fit different fixtures for different DUT, the probes on the fixture are capable of examining all the ICs on the printed circuit board assembly. Moreover, the fast testing speed, the accuracy of locating the defects, and a test coverage rate higher than both automatic optical inspection and automatic X-ray inspection, are all noted advantages of ICT.

A general ICT is equipped with a "manufacture defect analyzer" (MDA) to detect defects such as device damage, short, false welding and misplacement. However, MDA is only favorable for analog devices. A complete inspection of the digital circuits can be carried out by combining a "boundary-scan test" technique.

The Boundary-scan test is also known as JTAG test or IEEE1149.1. Such technique was proposed to IEEE committee by Join Test Action Group (JTAG) in 1988, and the standard of "Standard Test Access Port and Boundary-Scan Architecture" (IEEE std. 1149.1-1900) was established in 1990.

Connecting probes on the fixture to the testing point of DUT is the first step of conventional testing method. Once the probes are connected, the ICT generates signals to examine each DUT through the testing point. However, the complexity of printed circuit board assembly has increased significantly today, for example the number of pins is increased while the distance between the pins is decreased in devices such as CPU, ASIC, Chipset, etc. Such complexity change reduces the number of possible testing points. Boundary scan test provides a solution to the above mentioned problems. Today, circuits with boundary-scan function are commonly built in ICs for inspection purposes. Boundary-scan method scans through all the input and output pins of the integrated circuit devices in order to obtain the testing data of the said pins, or to examine whether the ICs and the printed circuit board are properly connected.

Referring to FIG. 1, it shows a block diagram of a conventional testing system arrangement, which includes an integrated circuit A (IC A) 10 and an integrated circuit B (IC B) 20, each contains a circuit with boundary-scan test function. Such a chip comprises four basic elements: Test Access Port (TAP) 30, TAP controller 40, Instruction Register (IR) and Data Register (DR), wherein only the TAP, TAP controller, IR, and some of the DRs are essential elements for operation. The required DRs are Boundary Scan Registers 50 and Bypass registers, while the other registers are optional. Next to the internal core-circuit, Boundary Scan Cells (BSCs) 55 are located between the internal core-circuit and the pins of ICs. BSCs serve as the probes inside the ICs; and serially connected BSCs form the Boundary Scan Register. During a test, at least four boundary-scan pins in TAP are used to control and convey the testing data through the TAP controller in IC. The four pins are: Test Data Output (TDO), Test Data Input (TDI), Test Clock (TCK), and Test Mode Select (TMS). A fifth pin, Test Reset (TRST), is optional. By inputting serial data to the TDI pin of IC A, which acts to send the test data to the BSCs, the test data can be shifted between BSCs. The test data can then be serially transferred from the TDO pin of IC A to the TDI pin of IC B, following a data shifting test in the BSCs of IC B. The shifted data can be observed at the TDO of IC B; a scan chain is herein completed. While the test data shifts to the output pin of BSCs in IC A, the internal connection within the chip and the interconnection between the chips of IC A and IC B carry out a parallel output to transfer the test data in BSCs to the bonding wires of a printed circuit board through the output pins. Meanwhile the test data is transferred to the input pins of IC B. Next, the BSCs of IC B first obtain the test data on the input pins by a parallel input and shift the data. Subsequently, the test data on output pins of IC B is compared to the test data on input pins of IC A; if the test data are the same, the connection between IC A and IC B, and the connections between some pins of IC A and some pins of IC B to the printed circuit B, are proper. On the contrary, the number of times data shifted indicates the number of improper connections between a pin of IC A and IC B. The boundary-scan test for a single IC can also be accomplished by alternating the serial and the parallel testing.

Boundary-scan test is capable of examining the internal function of IC and the pins connected to the printed circuit board. Boundary-scan test is a technique designed to overcome the difficulties in testing due to the improvement of IC manufacturing process. Except for reducing the number of probes on the fixture, tiny pins can also be examined easily by such a technique.

In order to examine the connection between the printed circuit board and the IC or the connector, Capacitive Coupling Test can be adopted as a convenient, reliable, and vector-less technique. Moreover, Capacitive Coupling Test does not damage the DUT since there is no destruction of DUT. Such method of examination uses an equivalent capacitance between the lead frame of IC and the extra sensor plate to establish a weak connection between the lead frame of IC and the extra sensor plate. The intensity of the coupled signals suggests the connecting condition between the electronic devices. By applying small AC signals to the testing pin of IC, the signals will couple to the sensor plate through the capacitance generated by the interface above and provide a reference voltage A if the printed circuit board is properly connected to the IC or the connector. On the contrary, if the printed circuit board is not properly connected to the IC, the value of capacitance at the interface will decrease and the signals cannot be coupled to the sensor plate easily, meanwhile a reference voltage B is provided. Whether an IC is properly connected to the printed circuit board can be determined by the difference of the small AC signals. Such a technique was first disclosed by Agilent Technologies in U.S. Pat. No. 5,254,953 in 1993, and it is now broadly adopted in the relevant industries.

As the manufacturing process for semiconductor improves, the printed circuit board assembly, for example the ball grid array (BGA) packaging, increases the density but lowers the volume of ICs at the same time, making it more difficult to reserve testing points on the DUT. The improvement of IC printed circuit board assembly suggests a significant growth in wire-density and a significant compression on board-space. Therefore, High Density Interconnect (HDI) technology is introduced to the manufacturing process of print circuit board to provide advantages of small size. By employing HDI technology, ICs or the connectors may be connected to the printed circuit board through its inner layers. As a result, the connections cannot be tested through the outside testing points as described above. Because the small AC signal cannot be delivered to the testing points of IC through outside probes, the inspection of the connectors that connect to the printed circuit board through its inner layers, such as PCI-E, DDR 2/3, CPU socket, becomes a great challenge.

Although other efforts have been developed in the probe-testing on the surface of high density printed circuit board, a proper testing method of delivering signals through the inner layer of printed circuit board to the DUT has not been achieved.

As a result, it is necessary to introduce a new technique to complement all the insufficiencies of prior arts. A testing system and method that overcomes the obstacles of signal delivery is required to increase the coverage of inspection and eliminate the blind spots of examination.

SUMMARY OF INVENTION

The invention provides a testing system and method for effectively examining whether the pins of a DUT are properly connected to a printed circuit board assembly.

The present invention comprise a testing signal source, a signal sensing unit, a signal processing unit, an analysis unit, and an integrated circuit with boundary-scan test function to examine whether the pins of a DUT are properly connected with a printed circuit board assembly.

In one aspect, the invention provides a testing method for a DUT, wherein the DUT is connected to a printed circuit board assembly, and the signal traces run through the inner layer of the printed circuit board assembly. The method comprises: outputting a test signal to the DUT, wherein the test signal is transferred through an integrated circuit with boundary-scan test function; obtaining a sensed signal; amplifying the sensed signal; and converting the sensed signal to frequency domain spectrum data, and determining whether pins of the DUT are properly connected to the printed circuit board assembly.

The testing system and method of present invention provides an examination of a DUT which electrically connects to a printed circuit board through the inner layer of the device. Particularly, the present invention provides a solution to the problems of HDI technology. The boundary-scan testing technology and the signal sensing unit are combined to deliver the testing signal from the integrated circuit with boundary-scan test function to the pins of DUT through the wires of printed circuit board assembly. Thereafter, the testing signal can be detected by the sensing unit located a distance from the DUT. This makes it possible to carry out an inspection even in a situation of high wire-density or on a probe-inaccessible surface.

DETAILED DESCRIPTION OF EMBODIMENTS OF THE INVENTION

The present invention provides a system and method of inspection which can effectively examine whether the connection pins of DUT, for example an integrated circuit(IC), are properly connected to a printed circuit board assembly.

Figure 1:
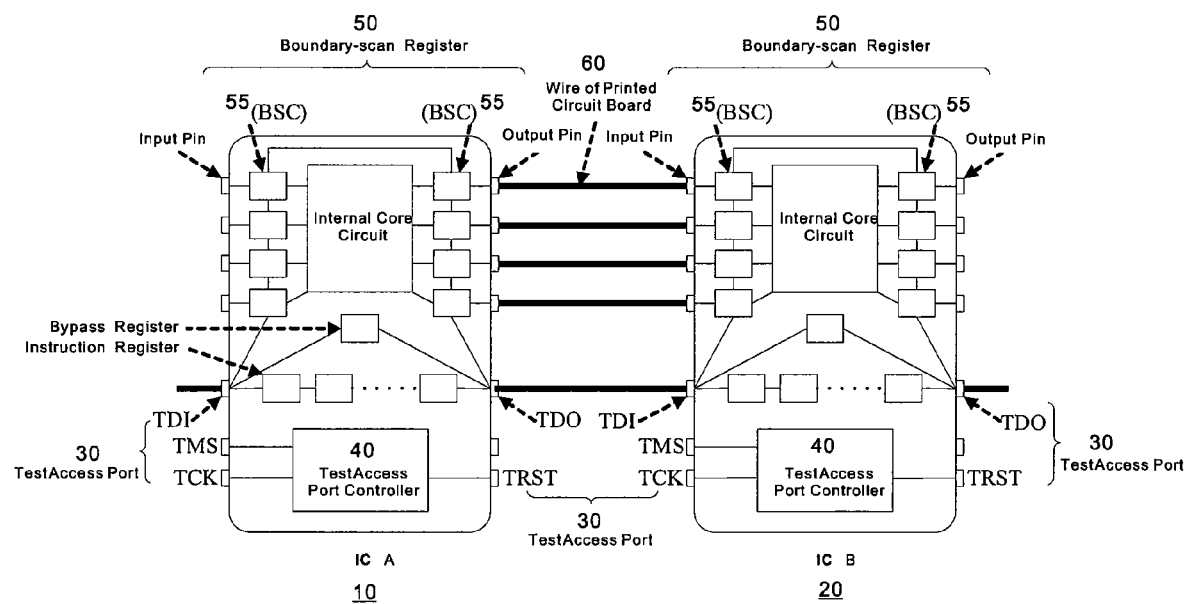
FIG. 1 shows a schematic diagram of an IC with boundary-scan test function.
Figure 2:
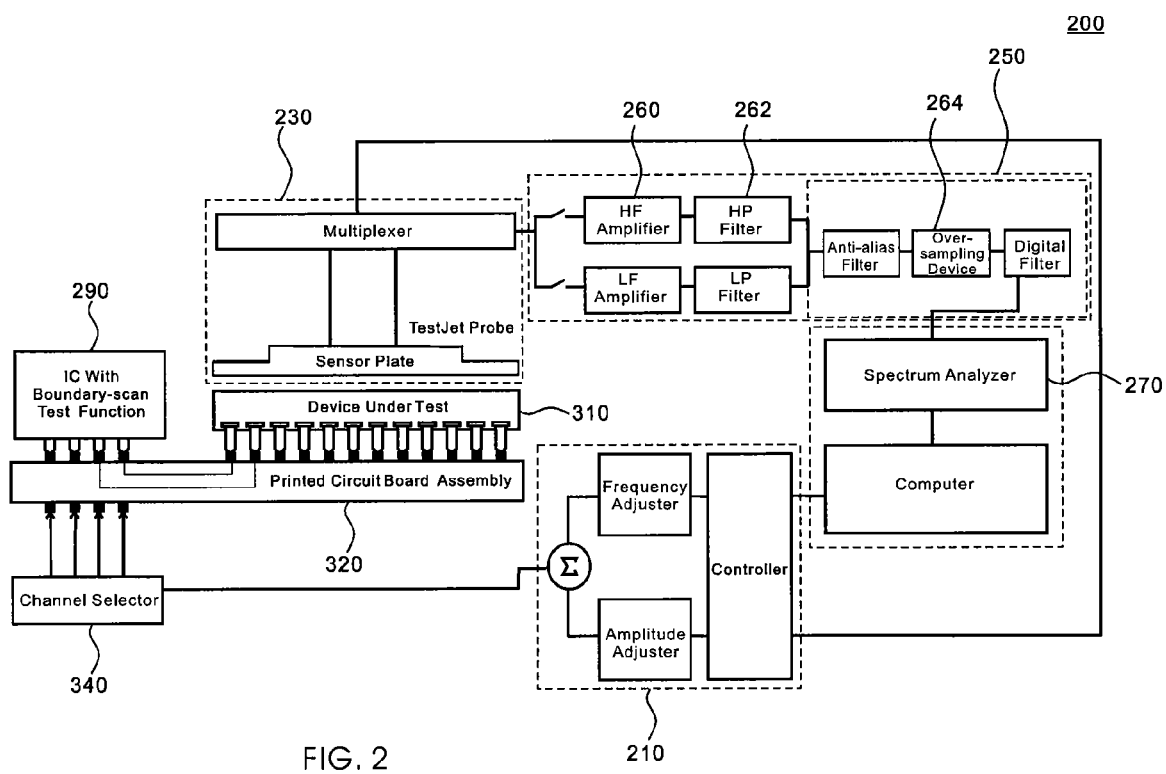
FIG. 2 shows a testing system comprises an IC with boundary-scan test function according to one embodiment of the present invention.

FIG. 2 shows a block diagram of the testing system of present invention. In this preferred embodiment, the testing system 200 comprises a testing signal source 210, a signal sensing unit 230, a signal processing unit 250, an analysis unit 270, and an IC with boundary-scan test function 290. The system 200 is capable of examining whether the pins of DUT 310(for example an IC) are properly connected to a printed circuit board assembly 320.

In one preferred embodiment, the testing signal source 210 which includes a controller, frequency adjuster and amplitude adjuster, outputs testing signals through a channel selector 340 to a IC with boundary-scan test function 290. The frequency of the testing signals can fall within the baseband of the expected testing signal source. For example, if the testing signals are expected to be harmonic signals with a frequency of 10 KHz, the baseband of testing signals can be 3.3 KHz. The electrical specification of the testing signals must meet the requirement of IC with boundary-scan test function to prevent any damage. The amplitude specification of the testing signals is adjusted by the signal source controller through the amplitude adjuster before proceeding to an output. The channel selector 340 will select a proper channel to deliver the signal, and the IC with boundary-scan test function will deliver the testing signal to the DUT 310 through the printed circuit board assembly 320. The signal sensing unit 230 will then examine the sensing signal that corresponds to the testing signal. In one preferred embodiment, the IC with boundary-scan test function 290 is a north bridge chip manufactured by Intel. The DUT 310 does not contain boundary-scan test function; however it could be a connector or other types of IC, for example, a connector of PCI express graphic card or a connector of DRAM such as DDR 2/3. In other preferred embodiments, DUT can be other types of IC with boundary-scan test function 290. In one preferred embodiment, the printed circuit board assembly 320 is a high density interconnected (HDI) four layered printed circuit board, and its signal lines run in the inner layer (as shown in drawings). Other preferred embodiments of the printed circuit board assembly 320 can be HDI printed circuit boards that are six layered or eight layered. And the signal traces run through the inner layer of the printed circuit board.

In one preferred embodiment, the signal sensing unit 230 comprises a tester such as TestJet probe and a multiplex card to deliver the sensing signals to the signal processing unit 250.

In one preferred embodiment, the signal processing unit 250 comprises a pair of high frequency and low frequency analog amplifiers 260 and a pair of filters 262 to process the sensing signals delivered from the sensing unit 230, meanwhile filtering the noise in the signals. The signal processing unit 250 could further comprises a over sampling device 264 for over sampling the sensing signals, and then converts the signals into digital frequency domain spectrum data for analysis of the analysis unit 270.

In order to determine whether the sensing signals are correct signals, the analysis unit 270, for example a spectrum analyzer, will analyze the digital sensing signals. By determining whether the signals fall within a range of predetermined reference values, the correctness of electrical connections of the pins can be determined. Moreover, the signals can be delivered to a computer for further analysis.

Figure 3:
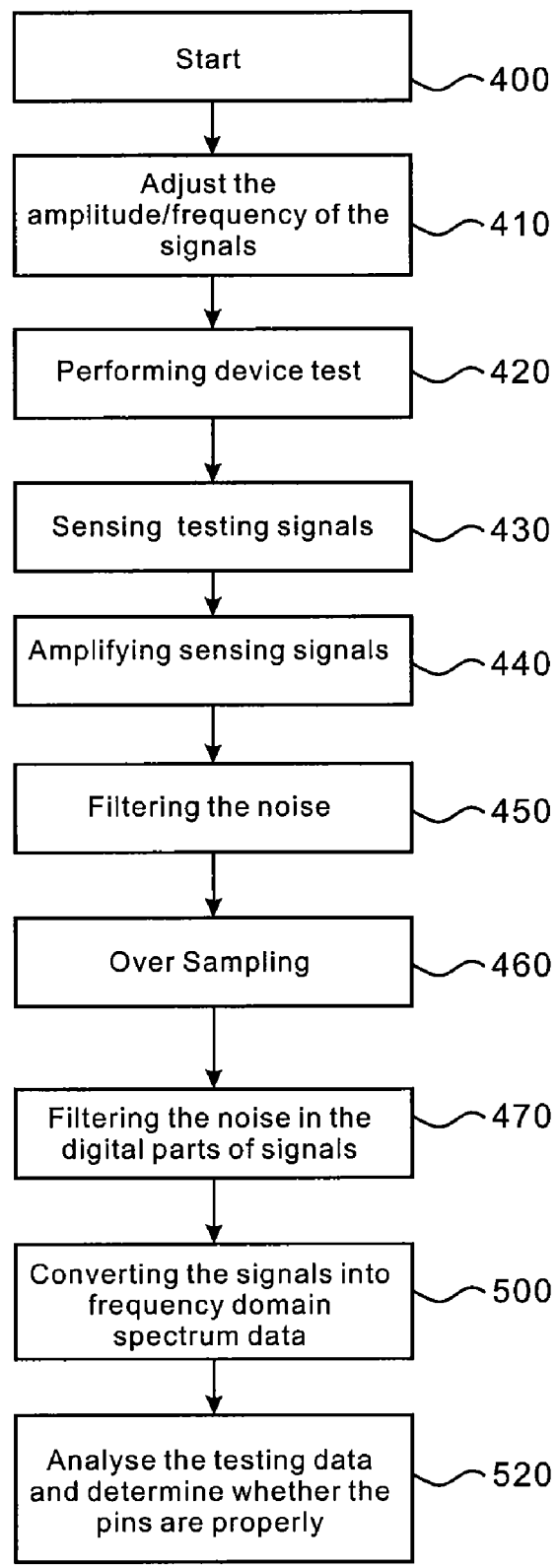
FIG. 3 shows a flow chart of testing method using an IC with boundary-scan test function according to one embodiment of the present invention.

FIG. 3 shows the flow chart of the testing method by using the testing system of the present invention.

Step 400 is the initial setting of the testing system.

The amplitude or frequency is adjusted in step 410, and the device is tested in step 420 to obtain the testing output signals.

The following steps of 430 to 470 respectively are sensing testing output signals (step 430), amplifying sensing signals (step 440), filtering the noise (step 450), over sampling (step 460) and filtering the noise of the digital parts of the signals (step 470).

Subsequently, the testing signals received will be converted to frequency domain spectrum data in step 500.

Finally, the testing output data will be analyzed in step 520, and whether the pins are properly connected will be determined. To this end the testing to the first pin of DUT 310 is finished.

Figure 4:
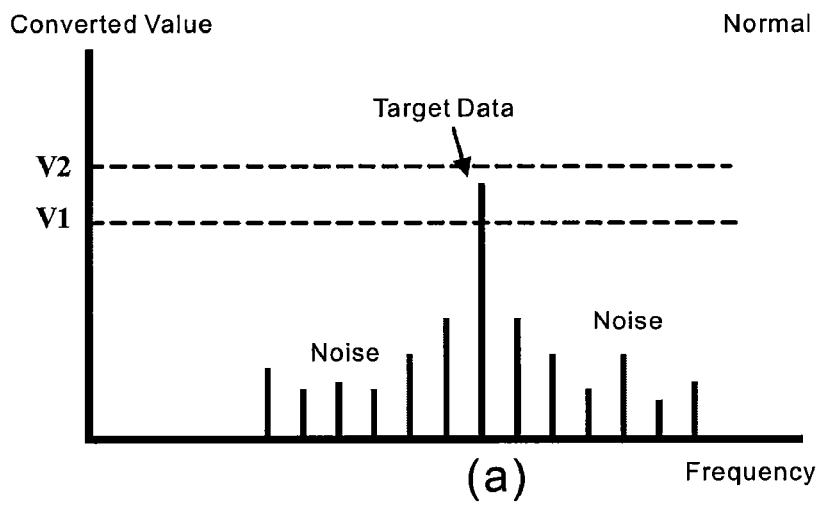
FIGS. 4a, 4b and 4c show the spectrum analysis according to one embodiment of the present invention.
Figure 4:
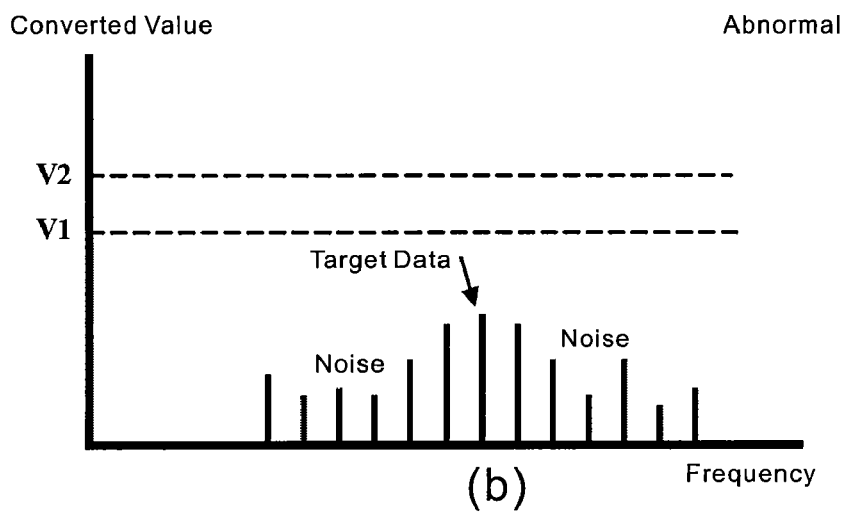
Figure 4:
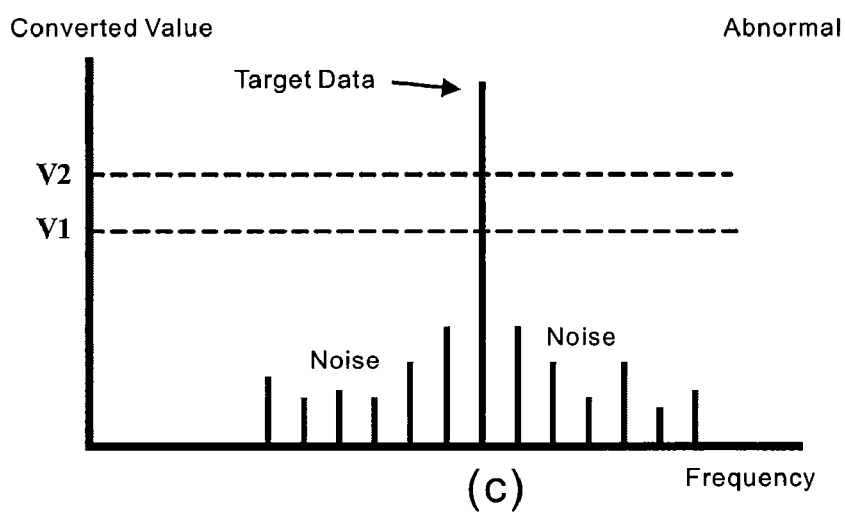

In one embodiment, step 520 is carried out by using FIGS. 4a to 4c to analyze the test result. For example, if the testing output signal falls within a predetermined range of converting values, it will be read as correct signals. However, if the testing output signals fall below or above the predetermined range of converting values as FIG. 4b or FIG. 4c, it will be read as incorrect ones.

Thereafter, the step 400 to step 520 can be repeated until every pin of the DUT is tested.

The testing system and method of present invention provides an inspection solution to the problems of HDI technology. The boundary-scan testing technology and the signal sensing unit are combined to deliver the testing signals from the integrated circuit with boundary-scan test function to the pins of DUT through the signal lines of printed circuit board assembly. Thereafter, the testing signals can be detected by the sensing unit located a distance from the DUT. This makes it possible to carry out an inspection in a situation of high density signal lines or on a probe-inaccessible surface.

While the present invention is disclosed by reference to the preferred embodiments and examples detailed above, it is to be understood that these embodiments and examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. An electronic component testing system, comprising:
   a testing signal source;
   an integrated circuit with boundary-scan test function, to receive the testing signal;
   a device under test, to receive the testing signal transferred from the integrated circuit with boundary-scan test function, wherein the device under test is connected to a printed circuit board assembly, and signal traces run through inner layer of the printed circuit board assembly; and
   an analysis unit, to determine whether pins of the device under test are properly connected to the printed circuit board assembly.

2. The testing system according to claim 1, further comprising:
   a signal sensing unit to provide a sensed signal induced from the device under test;
   a signal processing unit to process the sensed signal from the signal sensing unit.

3. The testing system according to claim 2, wherein the sensed signal is a capacitance value.

4. The testing system according to claim 1, wherein the device under test comprises a connector or an integrated circuit.

5. The testing system according to claim 4, wherein the connector is a DRAM module connector.

6. The testing system according to claim 4, wherein the connector is a graphic card connector.

7. A method for testing an electronic component, a device under test is connected to a printed circuit board assembly, and signal traces run through inner layer of the printed circuit board assembly, the method comprising:
   outputting a test signal to the device under test, wherein the test signal is transferred through an integrated circuit with boundary-scan test function;
   obtaining a sensed signal;
   amplifying the sensed signal; and
   converting the sensed signal to frequency domain spectrum data, and determining whether pins of the device under test are properly connected to the printed circuit board assembly.

8. The method according to claim 7, further comprising: a signal noise filtering step after amplifying the sensed signal.

9. The method according to claim 8, further comprising: an over sampling step after filtering signal noise.

10. The method according to claim 9, further comprising: a digital part of the signal noise filtering step after over sampling.

11. The method according to claim 7, wherein the sensed signal is a capacitance value.

12. The method according to claim 7, wherein the device under test comprises a connector or an integrated circuit.

13. The method according to claim 12, wherein the connector is a DRAM module connector.

14. The method according to claim 12, wherein the connector is a graphic card connector.

15. The method according to claim 7, wherein the device under test is without boundary-scan test function.

* * * * *